United States Patent [19]

Waggener et al.

[11] Patent Number: 5,644,137

[45] Date of Patent: Jul. 1, 1997

[54] STABILIZING SUPPORT MECHANISM FOR ELECTRON BEAM APPARATUS

[76] Inventors: Herbert A. Waggener, 7282 Wissota Dr., Chippewa Falls, Wis. 54729; Kurt Werder, 333 Monroe St. #6, Hoboken, N.J. 07030

[21] Appl. No.: 610,749

[22] Filed: Mar. 4, 1996

[51] Int. Cl.$^6$ ................................................. G01B 9/02
[52] U.S. Cl. ........................... 250/492.2; 250/442.11
[58] Field of Search .......................... 250/492.2, 492.1, 250/491.1, 440.11, 441.11, 442.11, 310; 356/345, 346, 347, 358–360, 363; 355/51, 55, 61; 378/79

[56] References Cited

U.S. PATENT DOCUMENTS

| | | | |
|---|---|---|---|
| 4,818,838 | 4/1989 | Young et al. | 250/441.1 |
| 4,891,526 | 1/1990 | Reeds | 250/492.2 |

*Primary Examiner*—Jack I. Berman
*Assistant Examiner*—Kiet T. Nguyen

[57] ABSTRACT

An electron beam apparatus is provided with a support mechanism upon which X and Y axis interferometers are mounted within a vacuum chamber. By employing a flat ring of a low coefficient of thermal expansion glass ceramic composition affixed beneath the chamber upper wall and to which the interferometers are mounted, the normal extremes of vacuum and heat as existing within the chamber are resisted to insure of a fixed horizontal alignment of the beams as projected by the interferometers during operation of the apparatus. Flexure mounts are included for the interferometer ring together with a magnetic shield disposed adjacent the ring undersurface. Stability of workpieces is further enhanced by the use of the same glass ceramic composition in the formation of the carrier and its reference plate of the apparatus.

13 Claims, 4 Drawing Sheets

STABILIZING SUPPORT MECHANISM FOR ELECTRON BEAM APPARATUS

BACKGROUND OF THE INVENTION

1. Field of the Invention

This invention relates generally to electron beam exposure devices and more particularly, to an improved mounting ring for supporting the X and Y axis interferometers in a stabilized manner resistant to the detrimental effects of both thermal and vacuum pressure conditions prevalent in the chamber of the device.

2. Description of the Prior Art

The stability of the various components employed in electron beam devices has long been addressed, in view of the thermal deviations evident within the vacuum chamber. The firm Schott & Gen. of Mainz, Germany developed a glass ceramic composition, registered under the trademark ZERODUR and which exhibits a high degree of thermal stability. U.S. Pat. No. 4,777,371 issued Oct. 11, 1988 to Baute is directed to a specific composition of this ZERODUR product wherein the crystalline phase has a negative thermal expansion, while that of the glass phase is positive whereupon the linear thermal expansion of the glass ceramic is largely compensated as a whole. By regulating the phases of the ZERODUR constituents, Baute proposes using his glass ceramic in the formation of the apparatus support components comprising the substrate supports for the masks, the receiving table or stage and its support arm and the substrates for the adjusting mirrors of the receiving table. Although this patent reference teaches the use of thermally stable material in the construction of various components in an electron beam apparatus, there is no suggestion therein of the present development wherein the upper wall of the vacuum chamber is protected by a ring of glass ceramic, with the interferometers being mounted thereupon, in order to maintain steady alignment of the optical axes of the interferometers, notwithstanding thermal variations as well as the influence of vacuum pressures within the apparatus vacuum chamber.

An X-ray lithography apparatus is shown in U.S. Pat. No. 4,694,477 issued to Siddall on Sep. 15, 1987 and is directed to means for carrying out single stage alignment which in this reference is produced by a plurality of piezoelectric transducers (PZTs) and although flexure strips are employed in this reference, they are connected to a stage plate. This is contrary to the present invention wherein alignment control is achieved through the use of interferometers and flexure mounts serve in the attachment of a glass ceramic ring to which the interferometers are affixed.

U.S. Pat. No. 4,703,181 issued Oct. 27, 1987 to Swall et al. depicts means to control thermal drift in an electron microscope and wherein movement of a specimen holder is regulated by an arrangement including a tube containing a close fitting rod. Control of drift in the present system is not by a mechanical element engaging a specimen holder but rather by interferometers attached to a glass ceramic ring underlying the upper wall of a vacuum chamber.

Stabilizing means for a workpiece in an electron beam apparatus is shown in U.S. Pat. No. 4,782,236 issued Nov. 1, 1988 to Chitayat and wherein spring rods and stabilizing posts are employed. This is in complete contrast to the construction as advanced herein and referenced above.

The particle beam lithography apparatus taught in U.S. Pat. No. 4,818,838 issued to Young et al. on Apr. 4, 1989 relates to means for preselecting a gap size between the tip of a vacuum seal apparatus and the workpiece surface and maintaining this gap during workpiece processing. This control is achieved through the use of gas bearings as opposed to the instant proposal wherein a glass ceramic ring of particular construction and location serves to support interferometers in an environment which is normally hostile to thermal variations and the influence of vacuum pressure.

A support mechanism for use in apparatus analogous to the present technology is advanced in U.S. Pat. No. 4,969,168 issued Nov. 6, 1990 to Sakamoto et al. and describes means for supporting a wafer upon a chuck. Initially, the wafer is attracted by the application of a vacuum and thereafter the support is by electrostatic attraction, a vast departure from the present system which concerns the use of a specific ring to underlie the upper wall of a vacuum chamber and serve to support interferometers.

U.S. Pat. No. 5,025,165 issued Jun. 18, 1991 to Chen et al. relates to an electron beam apparatus and specifically addresses alignment inaccuracies. Rather than providing means for insuring maintenance of the optical alignment of interferometers as taught herein, the Chen et al. device is directed to the inclusion of a particular reference mark(s) on the semiconductor body used in concert with an electromagnetic source and detector, both located exterior of a vacuum chamber.

The addressing of thermal stability in an electron beam apparatus will be found in U.S. Pat. No. 5,136,166 issued Aug. 4, 1992 to Young wherein, a thermally stable magnetic deflection assembly is formed with a plurality of magnetic coils and intermediate non-metallic thermally stable material. The instant improvement, on the other hand, is directed to thermal and vacuum resistant construction all within the working vacuum chamber, rather than in an electron column.

U.S. Pat. No. 5,214,290 issued to Sakai on May 25, 1993 relates to an electron beam lithography apparatus and is specifically directed to a workpiece supporting table and X-Y axis shifting mechanism therefore, unlike the current invention which is concerned with the inclusion of a glass ceramic ring for support of interferometers.

U.S. Pat. No. 5,280,178 issued to Engelen et al. on Jan. 18, 1994 concerns a charged particle beam apparatus and depicts a specimen holder comprising a resilient ring, as used in an electron microscope, unlike the instant development concerning a ring structure of specific composition for supporting interferometers to resist alignment drift due to thermal and vacuum pressure influences.

None of the above inventions and patents, taken either singly or in any combination, is seen to even remotely suggest or describe the instant invention as claimed herein.

SUMMARY OF THE INVENTION

By the present invention, an electron beam lithography apparatus is provided with improved means allowing for maintenance of stability of interferometers employed in controlling the movement of X and Y axis slides supporting a workpiece being processed. X and Y axis interferometers, normally supported by the upper wall of the vacuum chamber, are herein attached to a ring composed of glass ceramic exhibiting resistance to thermal and physical deflection, contraction or expansion. The glass ceramic interferometer ring includes flexure mounts and is additionally covered on its otherwise exposed undersurface, with a magnetic shield. To further enhance the stability of the components contained within the vacuum chamber, the workpiece carrier and its supporting reference plate are also constructed of the same glass ceramic composition.

Accordingly, one of the objects of the present invention is to provide an improved mounting structure for X and Y axis interferometers in an electron beam apparatus.

Another object of the present invention is to provide an improved mounting structure in an electron beam apparatus including a ring of glass ceramics mounted upon the undersurface of the upper wall of the vacuum chamber and to which the X and Y axis interferometers are affixed.

A further object of the present invention is to provide an improved mounting structure in an electron beam apparatus including a glass ceramic ring attached to the upper wall of the vacuum chamber and including flexure mounts, with X and Y axis interferometers supported by the ring.

Still another object of the present invention is to provide an improved mounting structure in an electron beam apparatus including a ring of glass ceramic composition supporting radiant energy X and Y axis alignment devices together with a workpiece carrier and supporting reference plate of similar glass ceramic.

These and other objects of the present invention will become readily apparent upon further review of the following specification and appended claims.

BRIEF DESCRIPTION OF THE DRAWINGS

Similar reference characters designate corresponding parts throughout the several figures of the drawings.

Similar reference characters designated corresponding parts throughout the several figures of the drawings.

DETAILED DESCRIPTION OF THE PREFERRED EMBODIMENT

Figure 1:
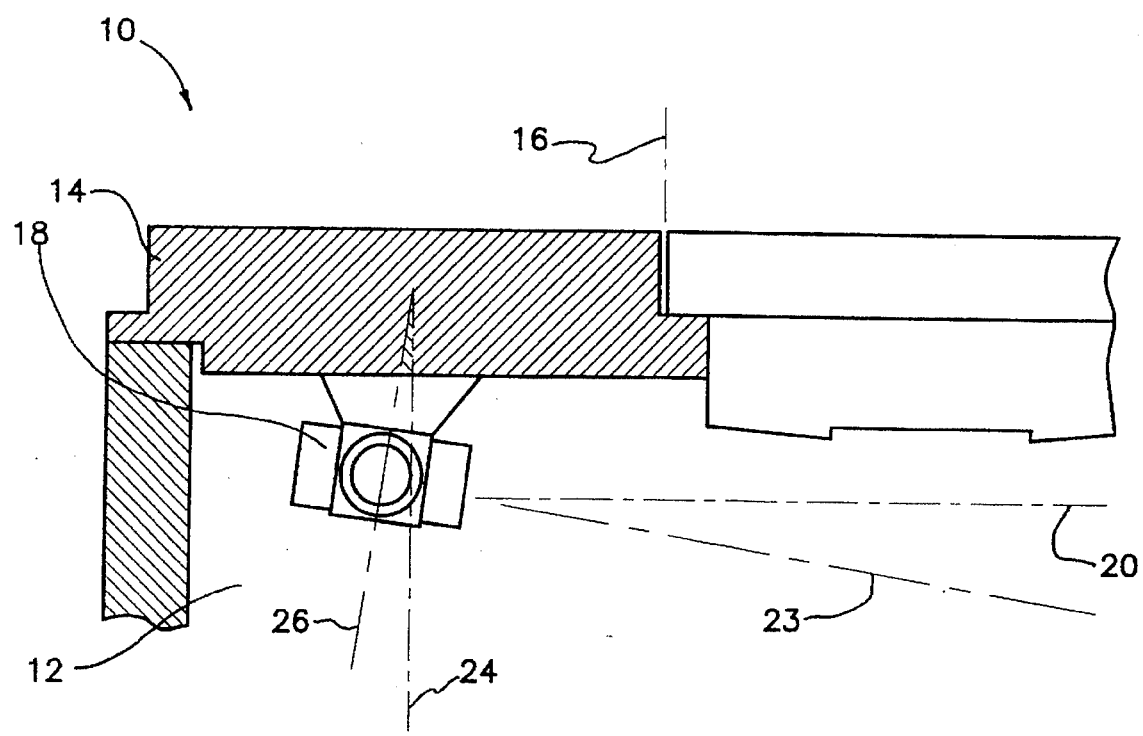
FIG. 1 is a fragmentary vertical sectional view of a typical electron beam exposure device, illustrating in an exaggerated manner, the problem of a deflected interferometer optical axis as produced by the differential pressures within and without the vacuum chamber.

Referring now to the drawings, particularly FIG. 1, the present invention will be seen to relate to improvements as applied to well known electron beam lithography apparatus of the type as generally shown in the previously discussed U.S. Pat. No. 4,818,838, the disclosure of which is incorporated herein by reference thereto. In the instance of the electron beam apparatus 10 of this drawing figure, a vacuum chamber 12 will be seen to be bounded upon its top limit by an upper wall or manifold 14 through which a beam column 16 is adapted to be disposed. Alignment control over a workpiece being processed within the chamber 12 is maintained through the operation of two pair of interferometers, one of which 18 is shown in this drawing figure. The function of such devices is well known in the art and need not be described in detail herein. Pairs of interferometers are employed to control alignment of a workpiece, respectively along each of its X and Y axes. The illustrated interferometer 18 is shown as they have been typically mounted that is, by attachment directly to the upper wall 14 of the chamber 12. In spite of the bulk or mass of most prior known walls 14, it has been observed that upon generation of heat during operation of the apparatus and, particularly upon application of the high vacuum pressure called for during use of these machines, a significant enough deflection of the wall 14 occurs and which is illustrated in an exaggerated manner in FIG. 1 of the drawings. With the interferometers 18 affixed to this wall, it follows that any deflection thereof will cause an angular displacement or deflection of the optical axis of the usually laser beam as radiated by the interferometer 18. The calibrated or normal optical axis 20 shown in a horizontal plane thus will be shifted or deflected to the offset axis 22 when the upper wall 14 is distorted, as the normal, vertical axis 24 of the fixedly attached interferometer 18 shifts to the angularly offset axis 26. Quite obviously during this distortion of the apparatus, the reflector (not shown in this Figure.), can not return an accurately directed beam to the interferometer and accordingly, errors will be generated by the apparatus. The forgoing shortcomings are rectified by the improvements described hereinafter.

Figure 2:
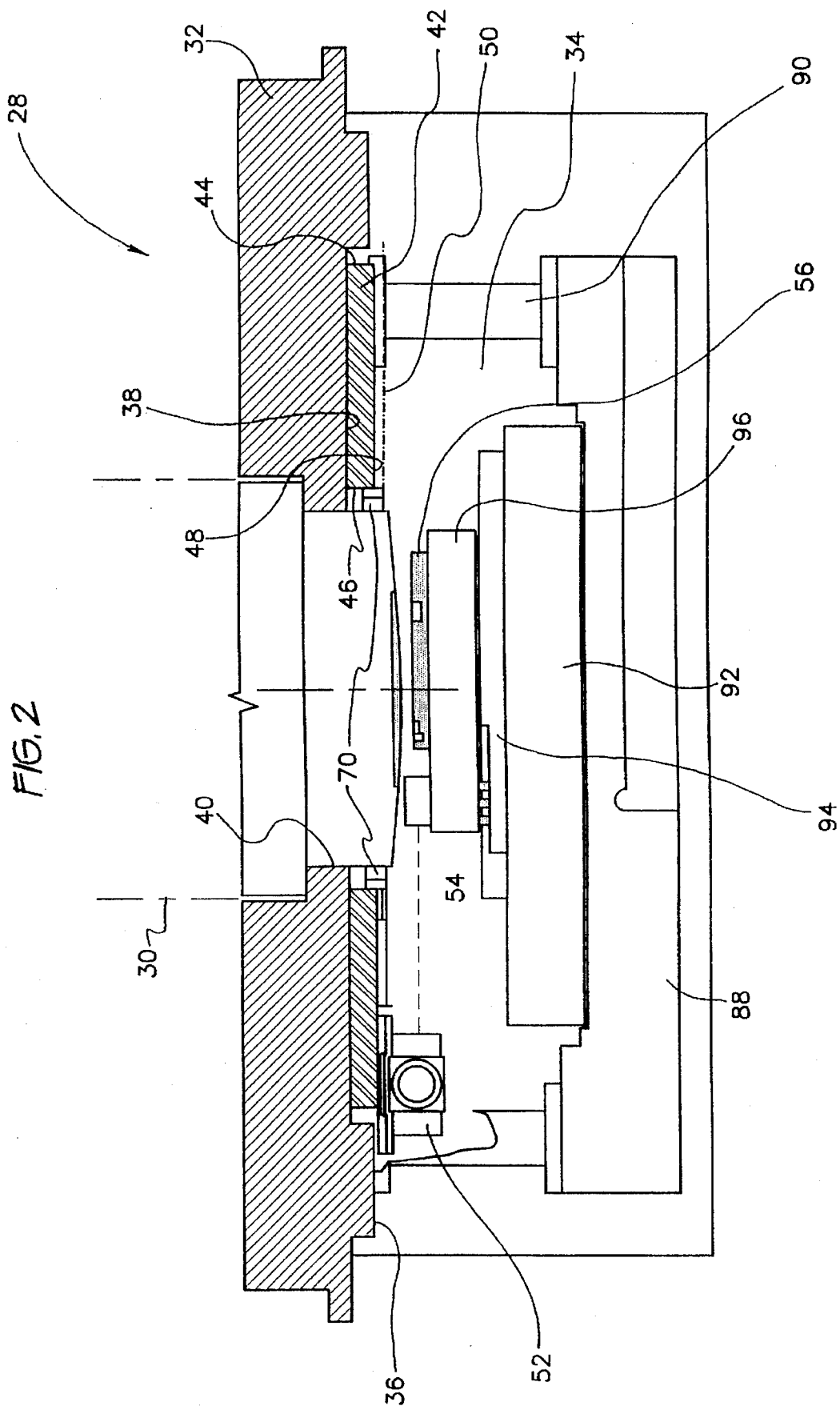
FIG. 2 is a front elevation, partly in section, of an electron beam exposure apparatus including the improved interferometer mounting ring of the present invention.

FIG. 2 illustrates the improved electron beam apparatus 28 wherein an appropriate particle beam column 30 and its related components is attached to an upper wall 32 of a vacuum chamber 34. Rather than comprising a flat, planar surface, the underside 36 of the upper wall 32 will be seen to be provided with a circular recess 38, concentric with and communicating with the opening 40 receiving the particle beam column 30. Disposed within this recess is a physically and thermally stable flat ring 42 having opposite outer and inner circular peripheries 44 and 46, respectively. This ring 42 comprises a glass ceramic composition such as ZERODUR, described heretofore. The undersurface 48 of the ring 42 is provided with means offering additional protection from attack by conditions existing within the chamber 34, by the suspension of a magnetic shield 50 coextensive with the ring undersurface. This metallic shield comprises a high permeability magnetic material and shields the ring 42 from inadvertent mechanical contact which could lead to breakage of the ring by shock. Additionally, the shield 50 provides electrostatic shielding of the ring 42 to prevent charging of the surface and consequent unwanted deflection of the ring and chamber upper wall 32. Furthermore, the shield will be understood to comprise a portion of the beam lower column magnetic shielding.

Figure 3:
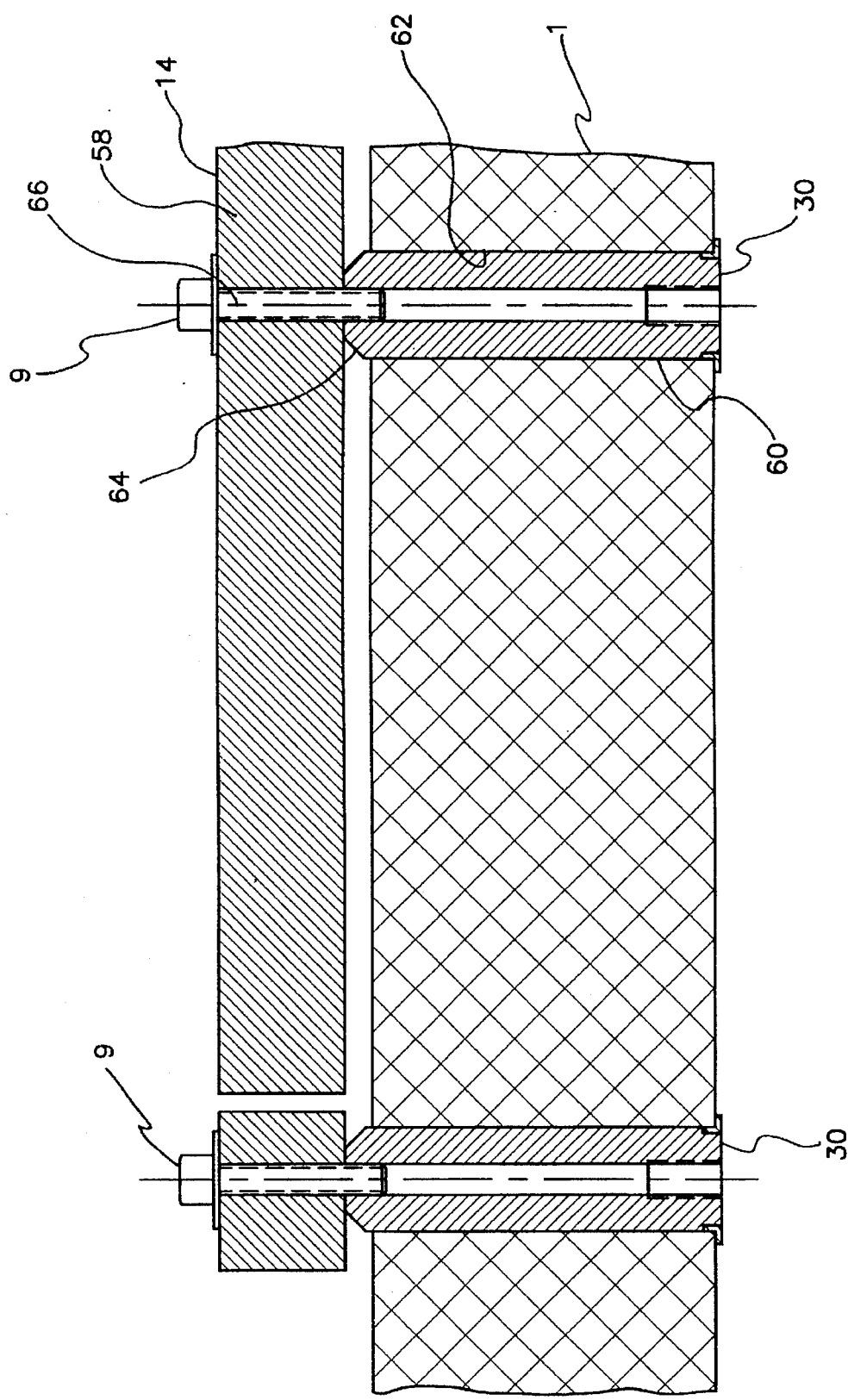
FIG. 3 is an enlarged sectional view illustrating the mounting plate serving to provide attachment of the interferometers to the ring.

Supported beneath the magnetic shield 50 and attached ring 42 are interferometers for controlling the alignment of the workpiece, respectively along the X and Y axes. For purposes of clarity, only one interferometer 52 is illustrated. As is known to those skilled in this art, the radiated beam from the interferometer 52 is directed to a mirror or reflective surface 54 attached to supporting means associated with the workpiece or carrier 56, with a pair of two such interferometers respectively controlling the alignment of the workpiece/carrier 56 in its two horizontal X and Y axes. Adapter plates 58 on each interferometer 52 provide means for the fixation of the interferometers to he ring 42 as shown most clearly in FIG. 3 and wherein the plate 58 will be seen to be attached in a slightly spaced apart manner from the ring lower surface 48. The attachment comprises a plurality of shouldered tapped fastener members 60 which are glued into holes 62 provided through the ring and terminate in tapered distal noses 64 projecting from the undersurface 48 of the ring. By employing machine screws 66 classified as #2 56, it is assured that any failure due to excessive loads will be attributable to failure of the screws. Tests have shown that over 2000 pounds are required to dislodge fastener elements assembled in this manner, with failure usually through breakage of the surrounding ring material.

Figure 4:
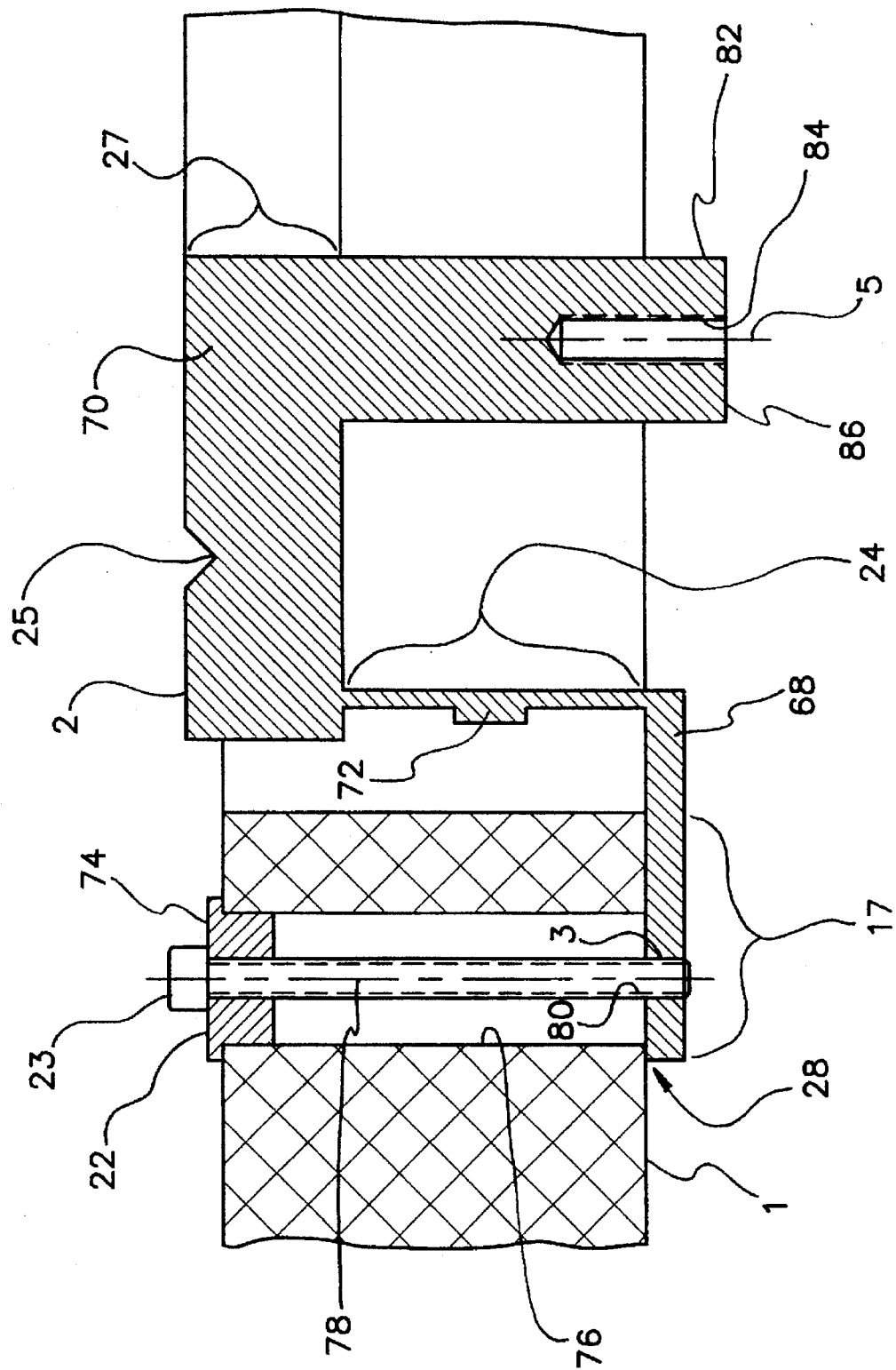
FIG. 4 is an enlarged sectional view depicting the flexure mount associated with the interferometer ring and providing support for the magnetic shield.

Now, the fixation of the ring 42 to the upper wall 32 of the vacuum chamber may be related, with reference being made to FIG. 4 of the drawings. Adjacent the inner periphery 46 of the ring 42 are a plurality of bonding pads 68 coextensively glued to the contiguous portion of the ring undersurface 48. Each pad 68 comprises the attachment for a mount adapter 70 fixed relative the upper wall 32 and these two components are joined to one another by a flexure 72 which is machined to have both sides straight and parallel. A shouldered washer 74 will be seen to be disposed in a bore 76 extending through the thickness of the ring 42 while a machine screw 78 passing through the washer 74 and bore 76 enters a tapped bore 80 in the gluing pad 68. It will be understood that the glued pad 68 provides the primary attachment of the ring to the each adapter 70.

The ring mount adapters 70 additional provide means for the suspension of the magnetic shield 50 aforementioned. A protrusion 82 extends downwardly from each ring mount adapter 70 and includes a tapped bore 84 opening to a flat face 86 disposed in a plane slightly spaced downwardly from the adjacent gluing pad 68. With this arrangement, suitable threaded fasteners (not shown) are employed to affix the magnetic shield 50 beneath the ring 42.

In the apparatus shown, a stage base 88 forms the lowermost component within the vacuum chamber 34 and includes a plurality of supports 90 maintaining fixed attachment between the stage base 88 and chamber upper wall 32. The stage base 88 provides a stable platform upon which the various elements supporting and providing translational movement to the workpiece/carrier 56 are mounted.

Mounted atop the stage base 88 are Y-axis and X-axis slides 92 and 94, respectively and which may be manipulated in any well known manner as controlled by the interferometers 52. A reference plate 96 will be seen to be disposed intermediate the workpiece/carrier 56 and X-axis slide 94. Both the carrier 56 and reference plate 96 are formed from the same glass ceramic composition as the interferometer mounting ring 42.

From the foregoing it will be appreciated that an improved arrangement is offered wherein an enhanced stability is provided for maintaining the alignment of interferometers in electron beam devices.

It will be understood that the present invention is not limited to the sole embodiment described hereinabove, but encompasses any and all embodiments within the scope of the appended claims.

We claim:

1. In an electron beam apparatus having a vacuum chamber bounded at its top by an upper wall provided with a centrally disposed electron beam column and including a plurality of interferometers, the improvement comprising;

a ring of low coefficient of thermal expansion glass ceramic composition, a mounting adapter attaching said ring to said upper wall, and said interferometers affixed to said ring within said vacuum chamber.

2. The electron beam apparatus according to claim 1 wherein, said ring includes a circular inner periphery surrounding said electron beam column.

3. The electron beam apparatus according to claim 2 wherein, said mounting adapter is adjacent said inner periphery.

4. The electron beam apparatus according to claim 1 including, an adapter plate on each said interferometer, a plurality of tapped fastener members affixed within said ring, and mating threaded fastener members carried by each said adapter plate engaging said tapped fastener members to secure said interferometers to said ring.

5. The electron beam apparatus according to claim 4 wherein, said tapped fastener members extend through said ring and are glued therewithin.

6. The electron beam apparatus according to claim 4 including, a shoulder on one end of said tapped fastener members and a nose on another end thereof, and said adapter plate affixed to said ring in a spaced apart disposition relative thereto and abutting said nose.

7. The electron beam apparatus according to claim 1 including, a workpiece carrier and reference plate within said chamber, and said workpiece carrier and reference plate composed of a low coefficient of thermal expansion glass ceramic composition.

8. The electron beam apparatus according to claim 7 wherein, said workpiece carrier and reference plate glass ceramic composition comprises ZERODUR.

9. The electron beam apparatus according to claim 1 wherein, said glass ceramic composition comprises ZERODUR.

10. The electron beam apparatus according to claim 1 wherein, said mounting adapter includes a flexure element.

11. The electron beam apparatus according to claim 1 including, a magnetic shield underlying said ring.

12. The electron beam apparatus according to claim 1 including, a plurality of said mounting adapters.

13. The electron beam apparatus according to claim 1 wherein, said mounting adapter includes a glued pad affixed to said ring and joined to an adapter main body by a flexure.

* * * * *